(12) United States Patent
Dietl et al.

(10) Patent No.: US 9,437,589 B2
(45) Date of Patent: Sep. 6, 2016

(54) PROTECTION DEVICES

(71) Applicant: Infineon Technologies AG, Neubiberg (DE)

(72) Inventors: Josef Dietl, Munich (DE); Andre Schmenn, Sachsenkam (DE); Damian Sojka, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 78 days.

(21) Appl. No.: 14/225,138

(22) Filed: Mar. 25, 2014

(65) Prior Publication Data

US 2015/0279833 A1   Oct. 1, 2015

(51) Int. Cl.
*H01L 23/495* (2006.01)
*H01L 23/48* (2006.01)
(Continued)

(52) U.S. Cl.
CPC ..... *H01L 27/0255* (2013.01); *H01L 23/49503* (2013.01); *H01L 23/49513* (2013.01);
(Continued)

(58) Field of Classification Search
CPC ............ H01L 23/051; H01L 23/3192; H01L 23/4334; H01L 23/485; H01L 23/49562; H01L 23/5222; H01L 23/5226; H01L 23/5329; H01L 23/544; H01L 23/562; H01L 23/565; H01L 21/31116; H01L 21/312; H01L 21/3185; H01L 21/50; H01L 21/76804; H01L 21/78; H01L 2924/01013; H01L 2924/01029; H01L 2924/01078; H01L 2924/01079; H01L 2924/14; H01L 2924/15153; H01L 2924/15311; H01L 2924/3011; H01L 29/0657; H01L 29/518; H01L 25/0657; H01L 2224/16; H01L 2224/48091; H01L 2224/48247; H01L 2224/73265; H01L 2224/034; H01L 2224/03466; H01L 2224/114; H01L 2224/11466; H01L 2224/274; H01L 2224/27466; H01L 2224/7518; H01L 2224/7618; H01L 2224/7718; H01L 2224/7918; H01L 23/4093; H01L 24/72; H01L 24/90; H01L 2224/72; H01L 2224/90; H01L 2224/45144; H01L 2224/16245; H01L 2224/48465; H01L 2224/48471; H01L 2224/48479; H01L 2224/73257; H01L 2924/00; H01L 23/49503; H01L 23/49513; H01L 23/49524; H01L 23/49537; H01L 23/49568; H01L 23/49575; H01L 27/0255

USPC ....... 257/620, 622, 640, 643, 666, 667, 668, 257/669, 674, 675, 676, 678, 688, 690, 692, 257/696, 698, 706, 707, 709, 712, 723, 734, 257/758, 773, 776, 778, 784, 787, 99, 100, 257/433, 772, 779, 368; 438/14, 15, 106, 438/111, 118, 123, 124, 112, 119, 121, 125, 438/126, 127, 612

See application file for complete search history.

(56) References Cited

U.S. PATENT DOCUMENTS 3,343,255 A * 9/1967 Donovan .......... H01L 21/76297
148/DIG. 85
6,140,702 A * 10/2000 Efland .................... H01L 24/48
257/762

(Continued)

FOREIGN PATENT DOCUMENTS

JP    10084072 A  *  3/1998
JP    2002368218 A    12/2002
JP    2012248736 A    12/2012

OTHER PUBLICATIONS

RF and Protection Devices, "AN 210 Effective ESD Protection Design at System Level Using VF-TLP Characterization Methodology," Application Note, Revision 1.3, Dec. 6, 2012, 29 pages.

(Continued)

*Primary Examiner* — Teresa M Arroyo
(74) *Attorney, Agent, or Firm* — Slater Matsil, LLP (57) ABSTRACT

In accordance with an embodiment of the present invention, a semiconductor package includes a die paddle and a protection device disposed over the die paddle. The protection device includes a first heat generating zone disposed in a substrate. The first heat generating zone is disposed at a first side facing the die paddle. A solder layer at the first heat generating zone joins the protection device with the die paddle.

14 Claims, 9 Drawing Sheets

(51) Int. Cl.
*H01L 23/52* (2006.01)
*H01L 23/04* (2006.01)
*H01L 23/34* (2006.01)
*H01L 29/40* (2006.01)
*H01L 27/02* (2006.01)

(52) U.S. Cl.
CPC ... *H01L23/49524* (2013.01); *H01L 23/49575* (2013.01); *H01L 23/49537* (2013.01); *H01L 23/49568* (2013.01); *H01L 2224/16245* (2013.01); *H01L 2224/45144* (2013.01); *H01L 2224/48465* (2013.01); *H01L 2224/48471* (2013.01); *H01L 2224/48479* (2013.01); *H01L 2224/73257* (2013.01)

(56) References Cited

U.S. PATENT DOCUMENTS

| | | | |
|---|---|---|---|
| 6,998,650 B1* | 2/2006 | Wu | F21K 9/00 257/100 |
| 2004/0056362 A1* | 3/2004 | Moriguchi | H01L 23/49524 257/773 |
| 2006/0022298 A1* | 2/2006 | Shiraishi | H01L 23/3107 257/509 |
| 2007/0080360 A1* | 4/2007 | Mirsky | H01L 23/3677 257/99 |
| 2008/0012045 A1* | 1/2008 | Muto | H01L 21/565 257/177 |
| 2008/0191342 A1* | 8/2008 | Otremba | H01L 23/49524 257/676 |
| 2010/0155915 A1* | 6/2010 | Bell | H01L 21/823487 257/676 |
| 2010/0283116 A1* | 11/2010 | Shimizu | H01L 21/823481 257/500 |
| 2011/0039374 A1* | 2/2011 | Lin | H05K 1/021 438/118 |
| 2011/0193208 A1 | 8/2011 | Xue et al. | |
| 2012/0248564 A1* | 10/2012 | Hauenstein | H01L 23/34 257/467 |
| 2012/0280246 A1* | 11/2012 | Cheah | H03K 17/567 257/76 |
| 2013/0082284 A1* | 4/2013 | Okumura | H02M 7/003 257/77 |
| 2015/0069599 A1* | 3/2015 | Gobl | H01L 24/72 257/719 |

OTHER PUBLICATIONS

STMICROELECTRONICS, "AN4275 Application note," IEC 61000-4-5 standard overview, Aug. 2013, pp. 1/11-11/11.

IEC, "Electromagnetic compatibility (EMC)—Part 4-5: Testing and measurement techniques—Surge immunity test," International Standard, IEC 61000-4-5, Second Edition, Basic EMC Publication, Nov. 2005, 54 pages.

Powell, D. E., et al., "Introduction to Voltage Surge Immunity Testing," IEEE Power Electronics Society Denver Chapter Meeting, Advanced Energy, Sep. 18, 2007, 66 pages.

On Semiconductor, "TVS/Zener Theory and Design Considerations," Handbook, HBD854/D Rev. 0, Jun. 2005, 127 pages.

Industrial and Multi-Market, "TVS Diode Transient Voltage Suppressor Diodes ESD5V3S1B-02LS Bi-directional Symmetrical Medium Capacitance ESD/Transient Protection Diode," Data Sheet, Revison 1.0, Apr. 8, 2011, 17 pages.

Wojnowski, M., et al., "Package Trends for Today's and Future mm-Wave Applications," 38th European Microwave Conference, received Jan. 24, 2008, 55 pages.

* cited by examiner

(PRIOR ART)

PROTECTION DEVICES

TECHNICAL FIELD

The present invention relates generally to semiconductor packages and in particular embodiments to protection devices.

BACKGROUND

Electrical Overstress (EOS) is considered as the exposure of a device or an integrated circuit (IC) to a current or voltage beyond its absolute maximum ratings. EOS can occur due to voltage overshoots resulting in high destructive currents.

One type of EOS is Electrostatic Discharge (ESD), which is known as transfer of electrostatic charge between bodies or surfaces at different electrostatic potential. ESD can happen due to sudden discharge of charge from a charged body. The ESD occurs when differently-charged objects are brought close together or when the dielectric between them breaks down, often creating a visible spark. ESD is a high current event in the typical range of 0.1 A to 30 A in a very short period of time from 1 ns to 200 ns.

Another type of EOS relates to fast transient voltage surges. The most intense transient relate to lightning and industrial surges. Transient overvoltage events are usually of short duration, from several microseconds to a few milliseconds, but longer than ESD events. Transient voltage surges waveforms can be oscillatory or impulsive. The waveforms typically have a rising wavefront usually on the order of 0.5 µs to 10 µs. Transient over-voltages may range from 1 kV to 50 kV.

Transient voltage surges typically enter into the devices through power lines and may arise due to switching and lightning transients. Such power line transients may be produced on the power system due to events such as power outages, tripped circuit breaker, load switching, capacitor bank switching, equipment faults and others. Lightning events may directly inject high currents and produce over-voltages. However, lightning may also result in indirect effects. For example, lightning strikes may induce voltages/currents on the conductors outside and/or inside a building. Lightning may also impact ground current flows resulting from nearby direct-to-earth discharges coupling into the common ground paths of the grounding system of the device.

A surge protector (or surge suppressor) is a device designed to protect sensitive electrical devices from transient voltage surges. For example, a surge protector may be designed to limit the voltage supplied to an electric device by either blocking or by shorting to ground any unwanted voltages above a safe threshold. Accordingly, surge protection devices have characteristics or operating regimes beyond which they do not function as intended. However, improvements in operating conditions result in improved functionality that translates into higher profit margin and/or higher product revenue.

SUMMARY OF THE INVENTION

In accordance with an embodiment of the present invention, a semiconductor package comprises a die paddle, and a P/N diode disposed over the die paddle. The P/N diode comprises a first doped region having a first doping type disposed in a substrate having a second doping type opposite to the first doping type. The first doped region is disposed at a first side facing the die paddle. A solder layer at the first doped region joins the P/N diode with the die paddle.

In accordance with an alternative embodiment of the present invention, a semiconductor package comprises a die paddle, a lead disposed proximate the die paddle, and a transistor disposed over the die paddle. The transistor comprises a first source/drain contact region and a gate contact region at a first side. The transistor further comprises a second source/drain region at a second side opposite the first side. A first solder layer at the first side joins the first source/drain contact region with the die paddle. A second solder layer at the first side joins the gate contact region with the lead.

In accordance with an alternative embodiment of the present invention, a semiconductor package comprises a die paddle, a protection device disposed over the die paddle. The protection device comprises a first heat generating zone disposed in a substrate. The first heat generating zone is disposed at a first side facing the die paddle. A solder layer at the first heat generating zone joins the protection device with the die paddle.

BRIEF DESCRIPTION OF THE DRAWINGS

For a more complete understanding of the present invention, and the advantages thereof, reference is now made to the following descriptions taken in conjunction with the accompanying drawings, in which:

FIG. 1, which includes FIGS. 1A and 1B, illustrates the implementation of surge protection devices, wherein

FIG. 2, which includes FIGS. 2A and 2B, illustrates a semiconductor package in accordance with an embodiment of the present invention, wherein

FIG. 4, which includes FIGS. 4A-4C, illustrates a semiconductor package in which the chip comprises a transistor in accordance with an alternative embodiment of the present invention, wherein FIG. 4A illustrates the cross-sectional view of the package, whereas

FIG. 7, which includes FIGS. 7A and 7B, illustrates a semiconductor package in which the solder layer is formed over a surface area larger than the heavily doped region in accordance with an embodiment of the present invention, wherein

FIG. 8, which includes

FIG. 9, which includes

DETAILED DESCRIPTION OF ILLUSTRATIVE EMBODIMENTS

In today's highly competitive markets, efficient over-voltage protection has become an integral part of IC/ASIC design for system reliability. Field failure is perceived as poor quality by disappointed customers and increases the number of warranty returns. Overlooking this issue may seriously impact a company's image and profitability.

However, some traditional approaches still rely on trial-and error practices to design protection devices. This can require several re-design loops, for instance, during compliance testing. Such practices increases costs and delay the time-to market of new electronic products.

To avoid such issues manufacturers follow industry standards that certify the transient over-voltage immunity of the device being sold. The International Electrotechnical Commission (IEC) has developed transient immunity standards which have become minimum requirements for original equipment manufacturers. The basic standards for immunity testing are known as the IEC 61000-4-X standards. Three of the IEC standards deal with transient immunity protection devices. First, IEC 61000-4-2 deals with Electrostatic Discharge (ESD) protection. IEC 61000-4-4 deals with Electrical Fast Transient/Burst (EFT) protection while IEC 61000-4-5 deals with Surge Immunity protection. In other words, IEC 61000-4-2 is related to ESD immunity while IEC 61000-4-4 and IEC 61000-4-5 are related to transient immunity.

IEC 61000-4-5 addresses the most severe transient conditions on both power and data lines. These are transients caused by lightning strikes and switching. Switching transients may be the result of power system switching, load changes in power distribution systems, or short circuit fault conditions. Lightning transients may result from a direct strike or induced voltages and currents due to an indirect strike.

The IEC 61000-4-5 standard defines a transient entry point and a set of installation conditions. The transient is defined in terms of a generator producing a given waveform and having a specified open circuit voltage and source impedance. Two different surge waveforms are specified: a 1.2×50 μs open-circuit voltage waveform and a 8×20 μs short-circuit current waveform. For example, the 8×20 μs short-circuit current waveform has a rising time of about 8 μs from the beginning of the pulse and reaches about 50% of the maximum voltage at about 20 μs from the beginning of the pulse. Immunity of the surge protection device to the transients is thus measured in a standardized manner using such standardized waveforms applied using a consistent set of procedures.

Figure 1A:
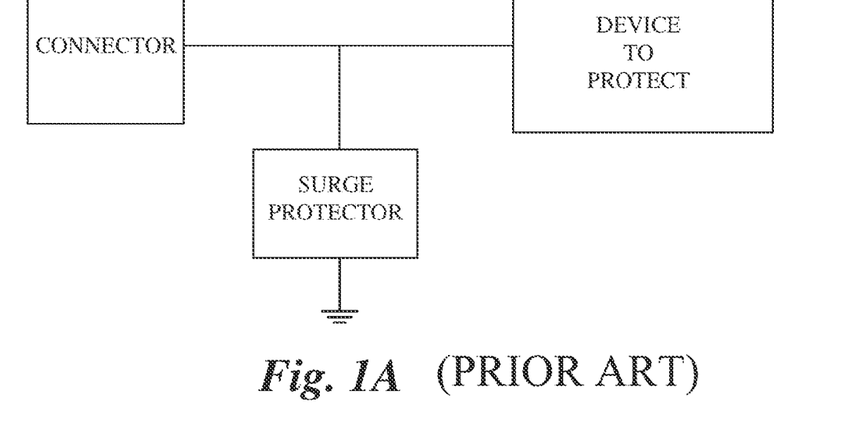
FIG. 1A illustrates a schematic of a surge protection circuit and FIG. 1B illustrates a current voltage relationship of a surge protection device.
Figure 1B:
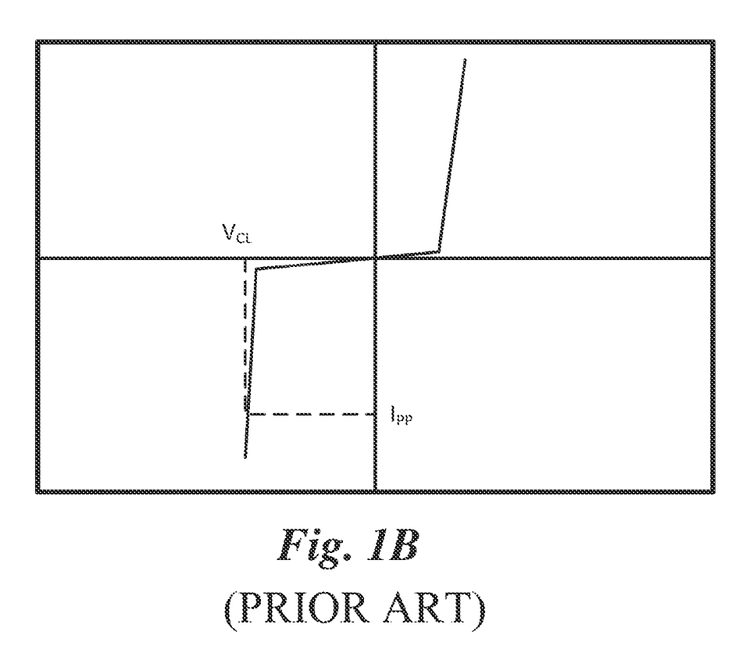

FIG. 1, which includes FIGS. 1A and 1B, illustrates the implementation of surge protection devices, wherein FIG. 1A illustrates a schematic of a surge protection circuit and FIG. 1B illustrates a current voltage relationship of a surge protection device.

As illustrated in FIG. 1A, the devices used to protect against IEC 61000-4-5 surges are generally a clamping device that removes the surge energy efficiently. These clamping devices are added in parallel to the device to be protected. As illustrated in FIG. 1B, the protection device limits the voltage only up to a specified value $V_{CL}$, which is the clamping voltage, by absorbing the surge current up to a peak pulse current $I_{PP}$. The protection device is designed to survive the peak surge current ($I_{PP}$), and to protect the device by limiting the surge voltage ($V_{CL}$) below the maximum admissible voltage of the device being protected. Using the IEC standards as an example, a protection device passing the standard's test must have a peak pulse current ($I_{PP}$) rating higher than the surge current applied according to the standard, for example, a 8/20 μs surge.

However, the performance of transient voltage suppression (TVS) diodes may become severely degraded due to heat generated within the device by the transient, especially when subjected to more than one pulse or transients. In a conventional protection diode, the anode pad of the chip is connected via a bonding wire and a solder ball to the anode pin of the package. However, the active region, where heat is generated, is separated from the heatsink by the thickness of the substrate. Further, large amount of heat is generated at the solder ball because of current crowding around the solder ball. Consequently, the solder ball may fail (e.g., by melting) even if the semiconductor region of the active region does not breakdown.

Embodiments of the present invention overcome these and other problems with conventional surge protection devices by efficiently removing thermal energy from the protection device. Further, embodiments of the present invention also help to reduce current crowding.

Figure 2A:
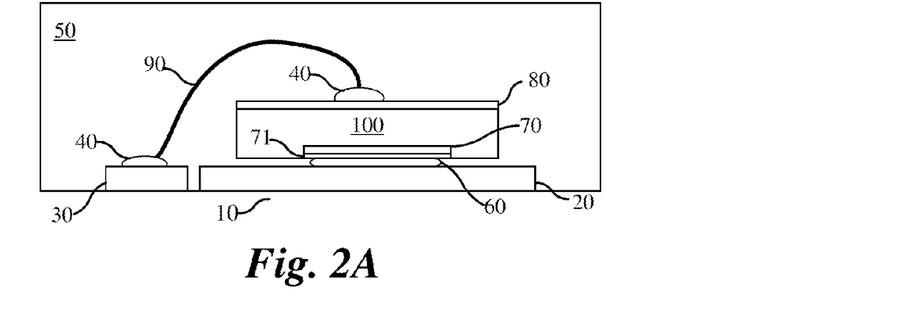
FIG. 2A illustrates a cross-sectional view and FIG. 2B illustrates a top view.
Figure 2B:
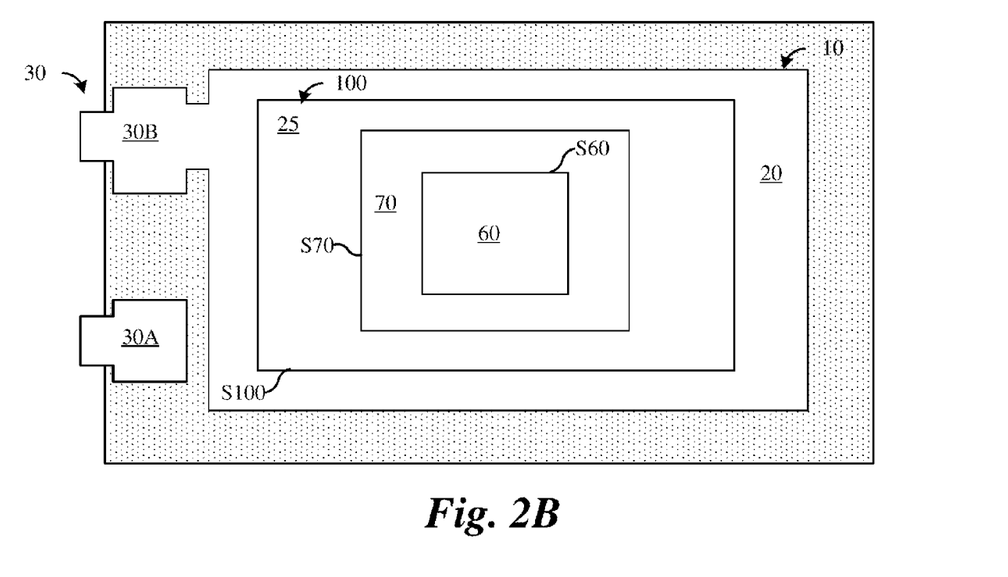

FIG. 2, which includes FIGS. 2A and 2B, illustrates a semiconductor package in accordance with an embodiment of the present invention. FIG. 2A illustrates a cross-sectional view and FIG. 2B illustrates a top view.

Referring to FIG. 2A, a chip 100 is disposed over a die paddle 20 of a lead frame 10. The lead frame 10 also includes lead 30 to which the chip 100 is coupled. In various embodiments, the chip 100 comprises a diode, for example, a P/N diode having a p/n junction. In one or more embodiments, the diode is a zener diode. In various embodiments, the chip 100 is a surge protection device.

For example, in one or more embodiments, the chip 100 comprises a heavily doped region 70 embedded within the substrate 25. In one embodiment, the substrate 25 may comprise a semiconductor wafer such as a silicon wafer. In other embodiments, the substrate 25 may comprise other semiconductor materials including alloys such as SiGe, SiC or compound semiconductor materials such as GaAs, InP, InAs, GaN, sapphire, silicon on insulation, for example. In one or more embodiments, the substrate 25 may comprise one or more epitaxial layers.

In various embodiments, the chip 100 is a discrete device. For example, in one or more embodiments, the chip 100 is a vertical device. In some embodiments, the chip 100 is a transistor. In one or more embodiments, the chip 100 is a vertical diode. In one particular embodiment, the chip 100 is a vertical zener diode.

In one embodiment, the heavily doped region 70 comprises an n+ region while the substrate 25 comprises a p-type doping. In another embodiment, the heavily doped region 70 comprises a p+ region while the substrate 25 comprises an n-type doping. In various embodiments, the heavily doped region 70 comprises a doping of at least $10^{19}$ cm$^{-3}$. In one or more embodiments, the heavily doped region 70 comprises a doping of about $10^{19}$ cm$^{-3}$ to about $10^{20}$ cm$^{-3}$.

In various embodiments, the substrate 25 comprises a doping of at most $10^{18}$ cm$^{-3}$. In one or more embodiments, the substrate 25 comprises a doping of about $10^{15}$ cm$^{-3}$ to about $10^{18}$ cm$^{-3}$, and about $10^{16}$ cm$^{-3}$ to about $10^{17}$ cm$^{-3}$ in one embodiment.

In one or more embodiments, the ratio of net doping in the substrate at the p/n junction between the substrate 25 and the heavily doped region 70 to the net doping in the heavily doped region is at least 1:100, and about 1:100 to about 1:10,000 in various embodiments.

Thus, the p/n junction between the heavily doped region 70 and the substrate 25 forms a heat generating zone during the transient because it is the highest resistance path within the protection device.

In various embodiments, the thickness of the heavily doped region 70 is less than one tenth the thickness of the substrate 25. In one or more embodiments, the thickness of the heavily doped region 70 is about 0.05 µm to about 1 µm.

A metal pad 71 is disposed over the heavily doped region 70 for contacting the heavily doped region 70. The metal pad 71 may comprise aluminum, copper, metal nitride such as titanium nitride, or a metal silicide in various embodiments.

The chip 100 is attached to the die paddle 20 of the lead frame 10 using a solder layer 60. In particular, the solder layer 60 is formed so as to not short the chip 100. For example, the solder layer 60 does not contact the substrate. This is facilitated because the solder layer 60 selectively attaches with the metal pad 71. In contrast, other types of attaching methods, such as glue are not selective and therefore attach to other regions as well as sidewalls of the substrate.

In one or more embodiments, the use of solder layer 60 instead of adhesive or pastes to attach the chip 100 to the die paddle 20 advantageously minimize the formation of shorts. The location of the solder layer 60 on the chip 100 can be precisely controlled without forming any overhanging portions.

In various embodiments, the solder layer 60 may comprise various solder materials, for example, silver, tin, lead, bismuth, indium, antimony, and cadmium. For example, the solder layer 60 may comprise a binary solder alloy such as tin-silver, tin-antimony, tin-indium, tin-bismuth, lead-indium, and lead-bismuth. In further embodiments, the solder layer 60 may comprise a ternary alloy such as tin-lead-silver, tin-lead-bismuth, tin-lead-indium.

The conductive layer 80 is disposed over the substrate of the chip 100. In various embodiments, the conductive layer 80 may include one or more metal layers. In various embodiments, the conductive layer 80 comprises aluminum. In alternative embodiments, the conductive layer 80 comprises copper. In further embodiments, the conductive layer 80 comprises a metal silicide. In additional embodiments, the conductive layer 80 comprises metal nitride. In one or more embodiments, the conductive layer 80 may comprise a material configured to wire bonded.

The conductive layer 80 is coupled to the lead 30 of the lead frame 10. In one or more embodiments, the conductive layer 80 may be coupled through wire bonds 90, which may be wire-bonded using solder balls 40.

In one or more embodiments, the wire bonds 90 may comprise aluminum. In alternative embodiments, the wire bonds 90 may comprise copper. In one case, the thickness of such aluminum wire bonds 90 may be about 10 µm to about 1000 µm. In another case the wire bonds 90 may comprise gold. In that case, the thickness of such gold wires may be about 10 µm to about 100 µm. In various embodiments, ball bonding or wedge bonding may be used to attach the wire bonds 90.

The lead frame 10 including the die paddle 20 and the lead 30 along with the chip 100 are packaged within an encapsulant 50. The encapsulant 50 provides mechanical support and hermetic seal over the chip 100.

In one embodiment, the encapsulant 50 comprises a mold compound. In other embodiments, other materials may be used as the encapsulating material. The encapsulant 50 may be applied using compression molding, injection molding, granulate molding, powder molding, or liquid molding in case of a mold compound. If necessary, curing process may be performed after applying the encapsulant 50.

FIG. 2B illustrates a bottom view of the semiconductor package in accordance with an embodiment of the present invention.

As illustrated in FIG. 2B, the chip 100 is disposed over the die paddle 20. The solder layer 60 is disposed under the heavily doped region 70. The plurality of leads 30 includes a first lead 30A and a second lead 30B.

As shown in FIG. 2B, the solder layer 60 has a first major surface S60 that is smaller than the surface area of the heavily doped region 70 having a second major surface S70. Further, the second major surface S70 of the heavily doped region 70 is designed to be smaller than the total surface area of the chip 100. The locations of the first lead 30A and the second lead 30B may vary in various embodiments.

In various embodiments, the design of the chip 100 including the thickness, doping, surface area of the heavily doped region 70, the thickness, surface area of the solder layer 60 is a compromise between efficiency of heat dissipation and electrical performance of the device.

Advantageously, using embodiments of the present invention, the surge protection device thus formed is very robust. For example, because the p/n junction formed between the heavily doped region 70 and the substrate 25 is adjacent the solder layer 60, heat generated within the diode is dissipated efficiently. This is because of the close proximity of the PN junction to the solder layer 60, which is coupled to the die paddle 20, which forms part of the heatsink.

In addition, the overlying substrate 25 helps to achieve a homogeneous flow of current through the PN junction diode. As a consequence, current crowding which can result in nonhomogeneous heat generation is avoided.

As an additional benefit, the low doped substrate 25 acts like a resistor connected in series to the diode. Consequently, this results in a voltage drop across the substrate 25. Therefore, the effective voltage at the PN junction diode is reduced, which increases the robustness of the PN junction diode due to the higher margin between the applied voltage from the surge and the clamping voltage of the Zener diode.

Accordingly, a higher energy transient is safely dissipated using embodiments of the present invention.

Figure 3:
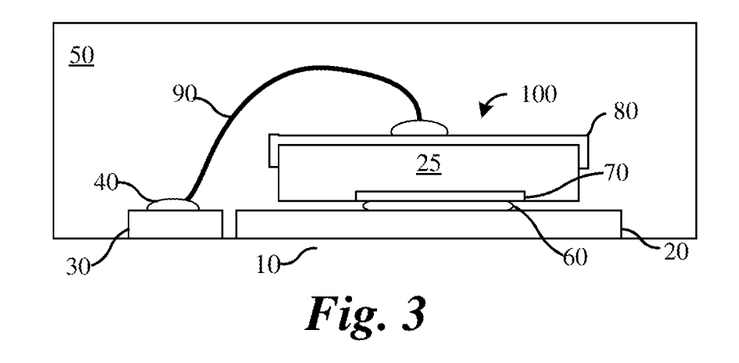
FIG. 3 illustrates a semiconductor package in which the back side conductive layer is formed on sidewalls of the chip in accordance with an alternative embodiment of the present invention.

FIG. 3 illustrates a semiconductor package in which a back side conductive layer is formed on sidewalls of the chip in accordance with an alternative embodiment of the present invention.

This embodiment illustrates that the back side conductive layer 80 may be formed on the sidewalls of the chip 100. However, because the solder layer 60 and the heavily doped region 70 are formed within the total surface area of the chip 100, the back side conductive layer 80 does not contact either the solder layer 60 or the heavily doped region 70, which would short the chip 100.

Figure 4A:
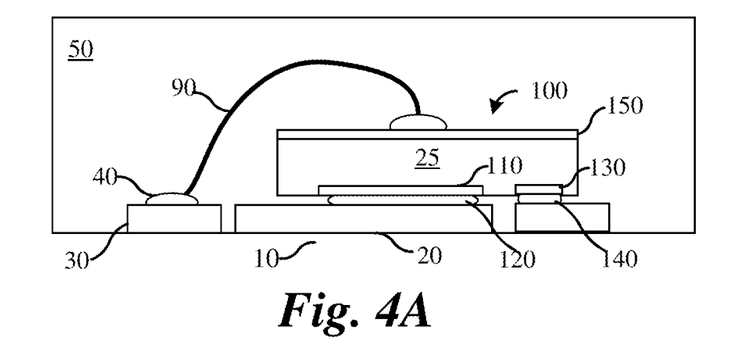
Figure 4B:
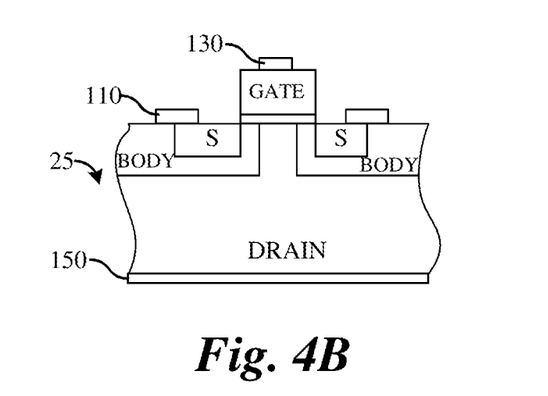
FIGS. 4B and 4C illustrate magnified cross-sectional view of a chip within the package in alternative embodiments.
Figure 4C:
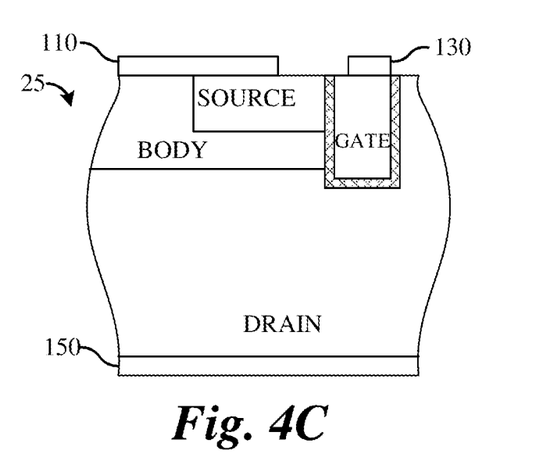

FIG. 4, which includes FIGS. 4A-4C, illustrates a semiconductor package in which the chip comprises a transistor in accordance with an alternative embodiment of the present invention. FIG. 4A illustrates the cross-sectional view of the package, whereas FIGS. 4B and 4C illustrate magnified cross-sectional view of a chip within the package in alternative embodiments.

Referring to FIG. 4A, the chip 100 includes a transistor having a source/drain contact 110, a gate contact 130 at a front side of the chip 100. A back side contact 150 is disposed on the back side of the chip 100. The source/drain contact 110 may be coupled to either the source or drain region of the transistor while the back side contact 150 may be coupled to the corresponding drain or source region, which is reverse of the region contacted by the source/drain contact 110. In one embodiment, the source/drain contact 110 is coupled to a source region.

The chip 100 may include a lateral or vertical channel region in various embodiments. The channel region is closer to the front side than the back side of the chip 100. For example, in or more embodiments, the channel is at a first distance to the first side and at a second distance to the second side, e.g., the first distance is at least ten times the second distance in one embodiment. The lateral channel region may be a surface channel region in one embodiment. For example, the channel region may be formed under the gate region as in a planar field effect transistor. Alternatively, the channel region may be formed vertically adjacent and along a trench gate, which extends into the substrate from the first side. Heat dissipation from the substrate 25 through the front side is greatly enhanced because of the closer channel region.

The lead frame 10 includes a first lead 30A coupled to the back side contact 150 through the wire bond 90 and solder balls 40. The source/drain contact 110 is coupled to the die paddle 20 by a first solder layer 120. A second lead 30B is coupled to the gate contact 130 through a second solder layer 140.

The transistor includes a channel region proximate the side facing the die paddle 20. In various embodiments, the channel region may be a lateral channel, which is parallel to the total surface area S100 of the chip 100. Alternatively, in other embodiments, the channel region may be a vertical channel, and may be perpendicular to the total surface area S100 of the chip 100.

In various embodiments, the chip 100 is a discrete vertical device, which may be field effect transistor, insulated gate bipolar transistor, bipolar transistor, junction field effect transistor. In various embodiments, the more resistive region of the transistor (heat producing zone) is closer to the side facing the die paddle 20 to improve the efficiency of heat transfer.

FIGS. 4B and 4C illustrate alternative embodiment of the chip 100.

In the embodiment of FIG. 4B, the chip 100 is a vertical field effect transistor. For example, the transistor includes a source region coupled to the source/drain contact 110 and a drain region coupled to the back side contact 150. Further a gate is disposed over the substrate 25 and is coupled to the gate contact 130. The channel region is formed laterally underneath the gate.

In the alternative embodiment illustrated in FIG. 4C, the chip 100 is a vertical trench field effect transistor. In this embodiment, the transistor includes a source region coupled to the source/drain contact 110 and a drain region coupled to the back side contact 150. Further a gate is disposed in a trench within the substrate 25 and is coupled to the gate contact 130. The channel region is formed adjacent the trench gate.

Figure 5:
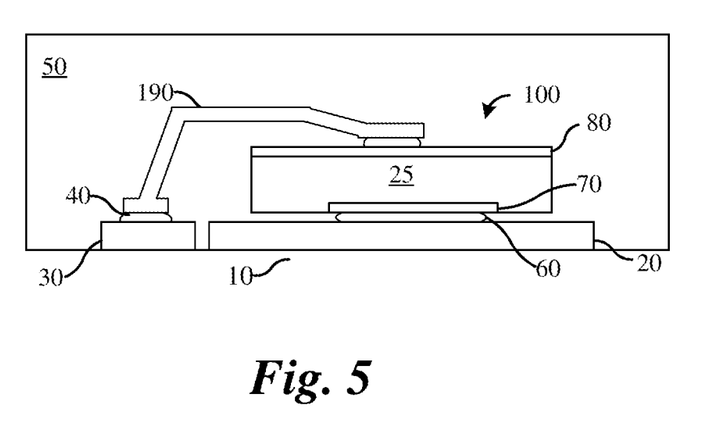
FIG. 5 illustrates a semiconductor package in which the back side conductive layer over a vertical diode is coupled to leads using clip interconnects in accordance with an alternative embodiment of the present invention.

FIG. 5 illustrates a semiconductor package in which the back side conductive layer over a vertical diode is coupled to leads using clip interconnects in accordance with an alternative embodiment of the present invention.

In various embodiments, the back side conductive layer 80 disposed on the back side of the substrate 25 of the chip 100 may be coupled to the leads using any suitable type of interconnect. For example, to carry high current capability, a clip interconnect 190 may be used in some embodiments. The clip interconnect 190 has a lower resistance than wire bonds and therefore less susceptible to heating and failure due to voltage surges. In other embodiments, the interconnects may be metal sheets, strips, galvanic interconnects and others.

Figure 6:
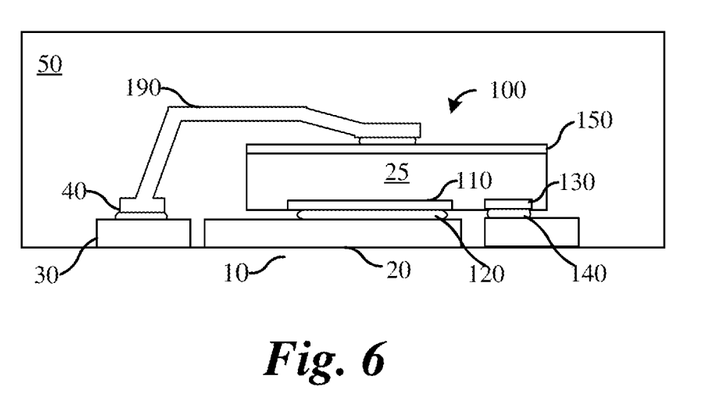
FIG. 6 illustrates a semiconductor package in which the back side conductive layer of a transistor is coupled to leads using clip interconnects in accordance with an alternative embodiment of the present invention.

FIG. 6 illustrates a semiconductor package in which the back side conductive layer of a transistor is coupled to leads using clip interconnects in accordance with an alternative embodiment of the present invention.

In this embodiment, the back side contact 150, which is coupled to a source or drain region of the transistor is coupled to the lead 30 using the clip interconnect 190.

Figure 7A:
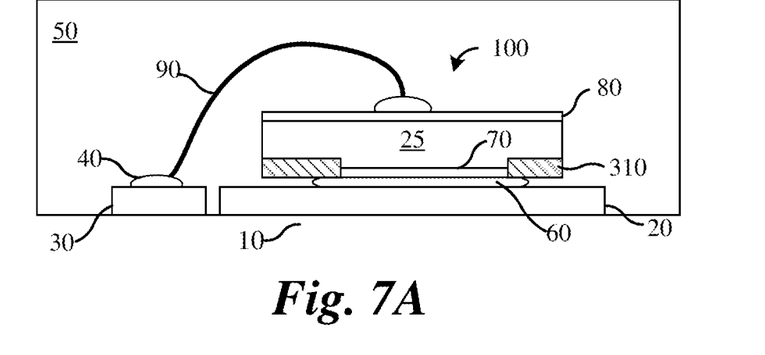
FIG. 7A illustrates a cross-sectional view and FIG. 7B illustrates a top view.
Figure 7B:
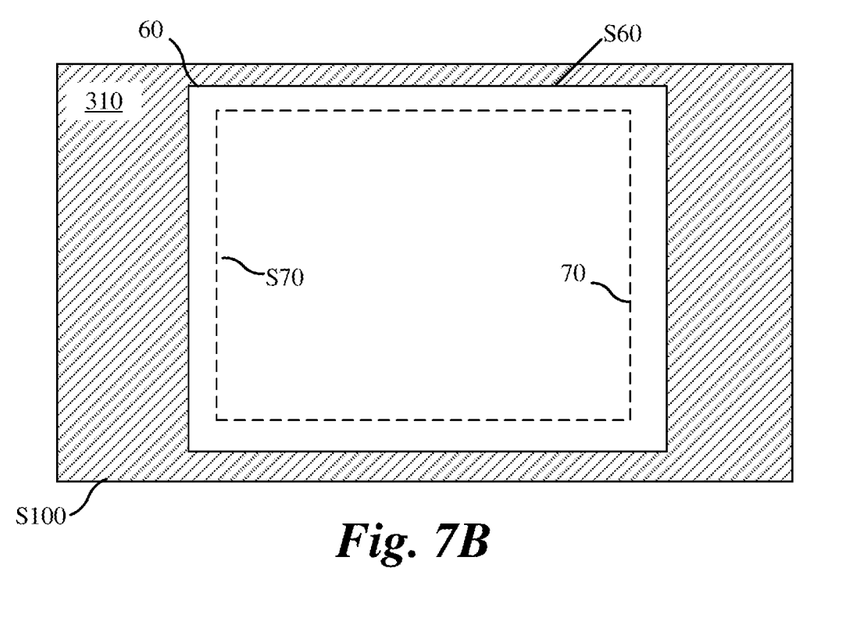

FIG. 7, which includes FIGS. 7A and 7B, illustrates a semiconductor package in which the solder layer is formed over a surface area larger than the heavily doped region in accordance with an embodiment of the present invention. FIG. 7A illustrates a cross-sectional view and FIG. 7B illustrates a top view.

Referring to FIGS. 7A and 7B, the front side of the major surface of the chip 100 is covered with an isolation region 310. The heavily doped region 70 is formed between the isolation region 310. The solder layer 60 is formed covering all of the heavily doped region 70 and also some portion of the isolation region 310. Thus, the solder layer 60 provides an improved contact to the heavily doped region 70 but at the same time does not short with the substrate 25 or any over-hanging metal from the back side conductive layer 80. The improved contact with the solder layer 60 improves (decreases) both the electrical resistance and thermal resistance.

Figure 8A:
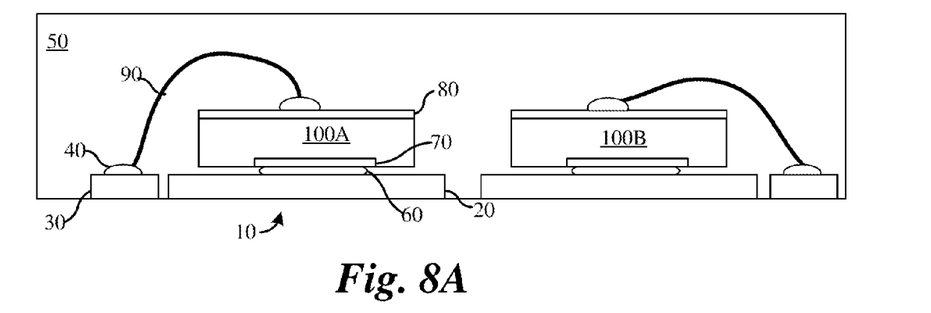
FIGS. 8A and 8B, illustrates a semiconductor package in which multiple dies are placed within a package in accordance with an embodiment of the present invention.
Figure 8B:
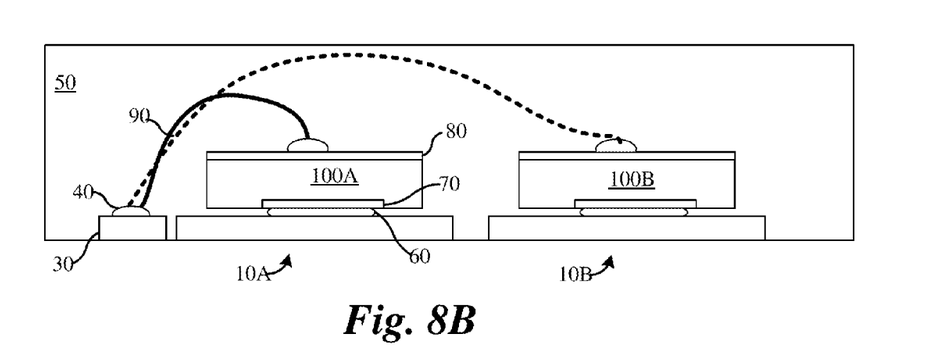

FIG. 8, which includes FIGS. 8A and 8B, illustrates a semiconductor package in which multiple dies are placed within a package in accordance with an embodiment of the present invention.

FIG. 8A illustrates an embodiment in which a first die 100A and a second die 100B are placed on separate die paddles 20. Each of the first die 100A and the second die 100B includes a heavily doped region 70 and is coupled to the corresponding die paddle 20 through a solder layer 60. Further, the first and second dies 100A and 100B are coupled to respective leads 30 using wire bonds 90, or other interconnects such as clips.

FIG. 8B illustrates an alternative embodiment in which the back side conductive layer 80 on the first die 100A and the back side conductive layer 80 on the second die 100B are coupled to the same lead. Thus, the two dies 100A and 100B are coupled together through at least at one lead. In further embodiments, the first die paddle 10A may be coupled to the second die paddle 10B as well so that the first die 100A is in parallel to the second die 100B. Alternatively, in some embodiments, the first die 100A and the second die 100B may have opposite doping. For example, in one embodiment, the first die 100A may have a n+ heavily doped region 70 embedded in a p-type substrate 25 while the second die 100B may have a p+ heavily doped region 70 embedded in a n-type substrate 25. Thus, a bi-directional protection device may be formed in a single package.

Figure 9A:
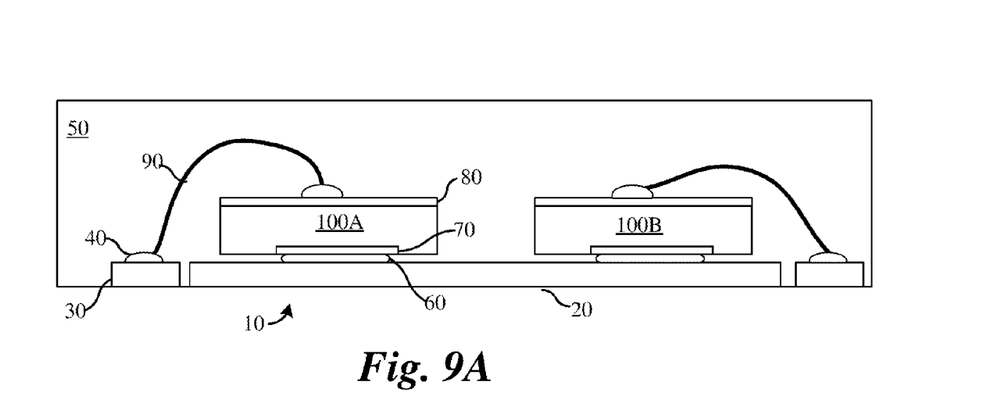
FIGS. 9A and 9B, illustrates a further embodiment of a semiconductor package comprising multiple dies mounted on a common die paddle.
Figure 9B:
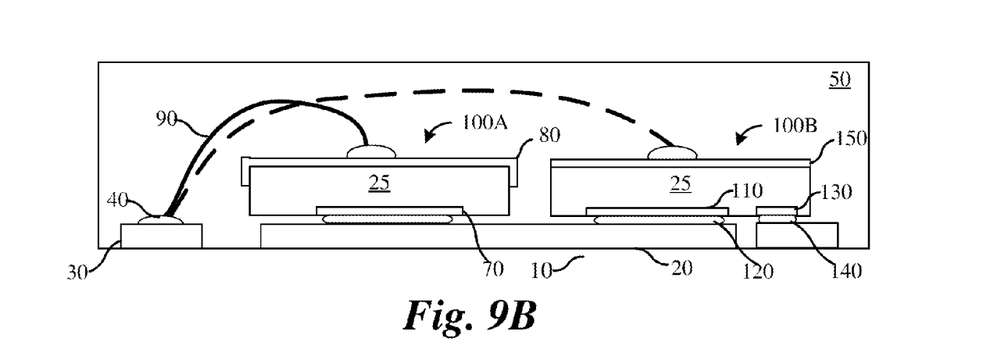

FIG. 9, which includes FIGS. 9A and 9B, illustrates a further embodiment of a semiconductor package comprising multiple dies mounted on a common die paddle.

In the embodiment of FIG. 9A, the heavily doped region 70 of the first die 100A and the heavily doped region 70 of the second die 100B through the common die paddle 20. The first die 100A may be similar to the second die 100B or may be doped oppositely.

FIG. 9B illustrates an alternative embodiment showing a zener diode and a transistor mounted on a common die paddle 20.

Figure 10:
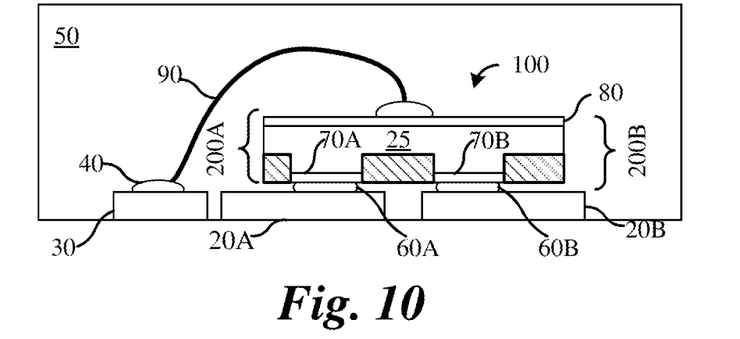
FIG. 10 illustrates a semiconductor package comprising a chip with at least two devices disposed in a substrate 25 in accordance with an embodiment of the present invention.

FIG. 10 illustrates a semiconductor package comprising a chip with at least two devices disposed in a substrate 25 in accordance with an embodiment of the present invention.

In one embodiment, the chip 100 includes a first device having a first heavily doped region 70A and a portion of the substrate 25 forming a first diode 200A. The chip 100 further includes a second diode 200B having a second heavily doped region 70B and another portion of the substrate 25 forming a second diode 200B. The first diode 200A may be coupled to the first die paddle 20A through a first solder layer 60A while the second diode 200B may be coupled to the second die paddle 20B through a second solder layer 60B.

Figure 11:
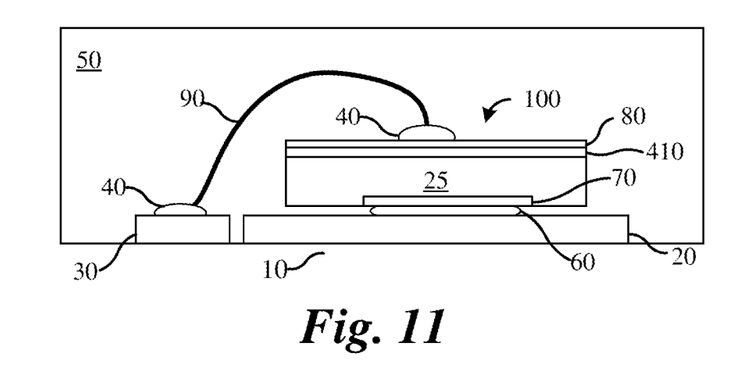
FIG. 11 illustrates a semiconductor package comprising a chip including a highly doped region in both front and back side of the substrate in accordance with an embodiment of the present invention.

FIG. 11 illustrates a semiconductor package comprising a chip including a highly doped region in both front and back side of the substrate in accordance with an embodiment of the present invention.

Referring to FIG. 11, the substrate 25 includes a heavily doped region 70 disposed in the substrate 25 as described in prior embodiments. Further, the substrate 25 may include a second heavily doped region 410 disposed at the opposite surface of the substrate 25. In one or more embodiments, the second heavily doped region 410 has the same doping type as the heavily doped region 70. Alternatively, in some embodiments, the second heavily doped region 410 has the same doping type as the substrate 25. In such embodiments, the second heavily doped region 410 provides a low resistance contact to the back side conductive layer 80.

Figure 12:
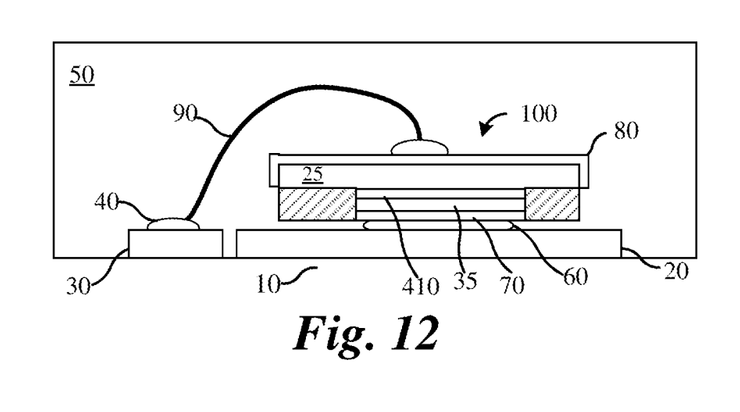
FIG. 12 illustrates a semiconductor package comprising a chip including two highly doped regions in the substrate in accordance with an embodiment of the present invention.

FIG. 12 illustrates a semiconductor package comprising a chip including two highly doped regions in the substrate in accordance with an embodiment of the present invention.

Referring to FIG. 12, the semiconductor package includes a heavily doped region 70, a base region 35, and a second heavily doped region 410. In various embodiments, the heavily doped region 70, and the second heavily doped region 410 have the same doping type while the base region 35 has the opposite doping type so that a transistor is formed by the heavily doped region 70, the base region 35, and the second heavily doped region 410. The substrate 25 may comprise the same doping type as the second heavily doped region 410.

Modifications of the embodiment include forming a field effect transistor as well as insulated gate bipolar transistor.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 2-12 may be combined with each other in alternative embodiments. It is therefore intended that the appended claims encompass any such modifications or embodiments.

What is claimed is:

1. A semiconductor package comprising:
   a die paddle;
   a P/N diode disposed over the die paddle, wherein the P/N diode comprises a first doped region having a first doping type disposed in a substrate having a second doping type opposite to the first doping type, wherein the first doped region is disposed at a first side facing the die paddle;
   a metal pad disposed over the first doped region, the metal pad being coplanar with a major surface of the substrate and covering the first doped region but not all of the major surface of the substrate;
   a solder layer at the metal pad joining the P/N diode with the die paddle; and
   a blanket metallic layer disposed over a second side of the P/N diode and covering all of a major surface of the substrate and a portion of sidewalls of the substrate.

2. The package of claim 1, further comprising:
   a lead isolated from the die paddle; and
   an interconnect coupling the blanket metallic layer to the lead.

3. The package of claim 1, wherein a thickness of the first doped region facing the die paddle is less than one tenth the thickness of the substrate.

4. The package of claim 1, further comprising an encapsulant disposed over the P/N diode, and the die paddle.

5. The package of claim 1, wherein the first doped region has a first surface area along a major surface of the substrate, and wherein the first surface area is smaller than the total surface area of the substrate along the major surface of the substrate.

6. The package of claim 5, wherein the solder layer has a second surface area along the major surface of the substrate, wherein the second surface area is different from the first surface area.

7. The package of claim 5, wherein the solder layer has a second surface area, wherein the second surface area is larger than the first surface area.

8. A semiconductor package comprising:
   a die paddle;
   a lead disposed proximate the die paddle;
   a bipolar transistor disposed over the die paddle in a semiconductor substrate, the bipolar transistor comprising a first side facing the die paddle and a second side facing away from the die paddle, the transistor comprising a first heavily doped region and a base region at the first side, the transistor further comprising a second heavily doped region disposed in the semiconductor substrate between the first side and the second side;
   isolation regions surrounding the first heavily doped region, the base region, and the second heavily doped region;
   a first solder layer at the first side joining the first heavily doped region with the die paddle, wherein, in a plane along a major outer surface of the substrate, an area of a surface of the substrate between the isolation regions comprising the first heavily doped region is greater than an area of the first solder layer; and a second solder layer at the second side joining the substrate with the lead.

9. The package of claim 8, further comprising an encapsulant disposed over the bipolar transistor and the die paddle.

10. The package of claim 8, further comprising:
a P/N diode disposed over the die paddle, wherein the P/N diode comprises a first doped region having a first doping type disposed in a substrate having a second doping type opposite to the first doping type, wherein the first doped region is disposed facing the die paddle; and
a third solder layer at the first doped region joining the P/N diode with the die paddle.

11. A semiconductor package comprising:
a die paddle;
a protection device disposed over the die paddle, the protection device having a first side and an opposite second side, the first side comprising a first major outer surface facing the die paddle, wherein the protection device comprises a first heat generating zone disposed in a semiconductor substrate, wherein the first heat generating zone is disposed at the first side facing the die paddle, wherein the first heat generating zone is disposed in a central portion of the first major outer surface of the protection device and is surrounded by an isolation region that is disposed at a peripheral region of the first major outer surface, wherein the first heat generating zone faces and overlaps with a central portion of the die paddle and the isolation region faces and overlaps with a peripheral region of the die paddle, wherein the central portion of the die paddle is surrounded by the peripheral region of the die paddle; and
a solder layer at the first heat generating zone joining the protection device with the die paddle, wherein the solder layer overlaps with all of the exposed surface of the first heat generating zone and a portion of the isolation region.

12. The package of claim 11, further comprising a blanket metallic layer disposed over a second side of the protection device.

13. The package of claim 11, wherein a thickness of the first heat generating zone is less than one tenth the thickness of the substrate.

14. The package of claim 11, further comprising an encapsulant disposed over the protection device and the die paddle.

* * * * *